United States Patent
Tanaka et al.

(10) Patent No.: US 7,985,517 B2
(45) Date of Patent: Jul. 26, 2011

(54) LITHOGRAPHY SIMULATION METHOD, COMPUTER PROGRAM PRODUCT, AND PATTERN FORMING METHOD

(75) Inventors: Satoshi Tanaka, Kawasaki (JP); Akiko Mimotogi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 12/477,725

(22) Filed: Jun. 3, 2009

(65) Prior Publication Data
US 2009/0305172 A1 Dec. 10, 2009

(30) Foreign Application Priority Data
Jun. 4, 2008 (JP) .................... 2008-147106

(51) Int. Cl.
*G03F 9/00* (2006.01)
(52) U.S. Cl. .............. 430/30; 430/5; 430/313; 430/323; 716/53
(58) Field of Classification Search ................ 430/5, 30, 430/313, 323; 716/53
See application file for complete search history.

(56) References Cited

U.S. PATENT DOCUMENTS
2008/0163142 A1 * 7/2008 White et al. ............... 716/5
2008/0301621 A1 12/2008 Fukuhara et al.

FOREIGN PATENT DOCUMENTS
JP 2007-248391 9/2007
* cited by examiner

*Primary Examiner* — Christopher G Young
(74) *Attorney, Agent, or Firm* — Finnegan, Henderson, Farabow, Garrett & Dunner, L.L.P.

(57) ABSTRACT

A lithography simulation method for estimating an optical image to be formed on a substrate when a mask pattern is transferred onto the substrate includes dividing the mask pattern into first calculation areas having sizes determined by a range affected by OPC, the range being obtained correspondingly to an exposure wavelength, a numerical aperture and an illumination shape which are used in the transferring the mask pattern onto the substrate, dividing the each of the first calculation areas into second calculation areas, calculating first electromagnetic field distributions formed by illuminating the mask pattern with exposure light and corresponding to the second calculation areas, obtaining second electromagnetic field distributions corresponding to the first calculation areas by synthesizing the first electromagnetic field distributions for each of the first calculation areas, and calculating the optical image to be formed on the substrate by using the second electromagnetic field distributions.

11 Claims, 4 Drawing Sheets

☐ Reference area on wafer Aref   ☐ Calculation area on wafer Asim
☐ Reference area on mask Bref    ☐ Calculation area on mask Bsim
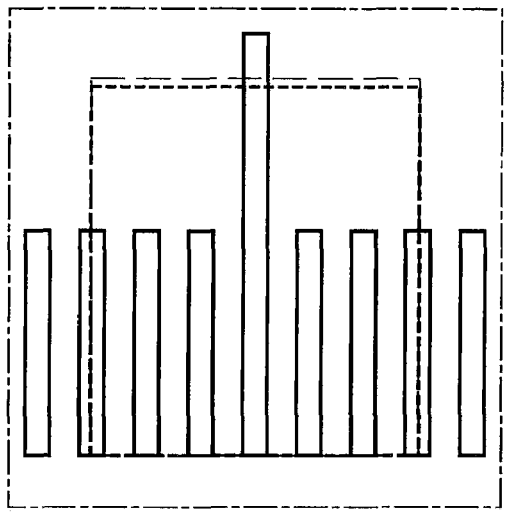
F I G. 1A
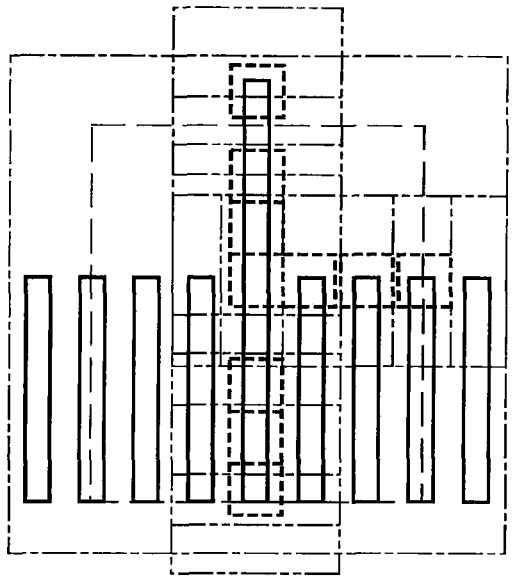
F I G. 1B
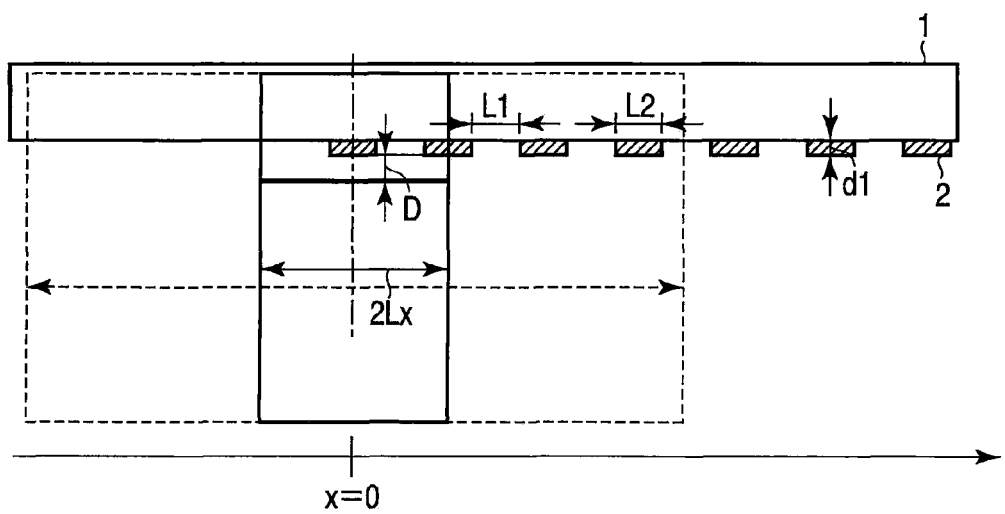
F I G. 2

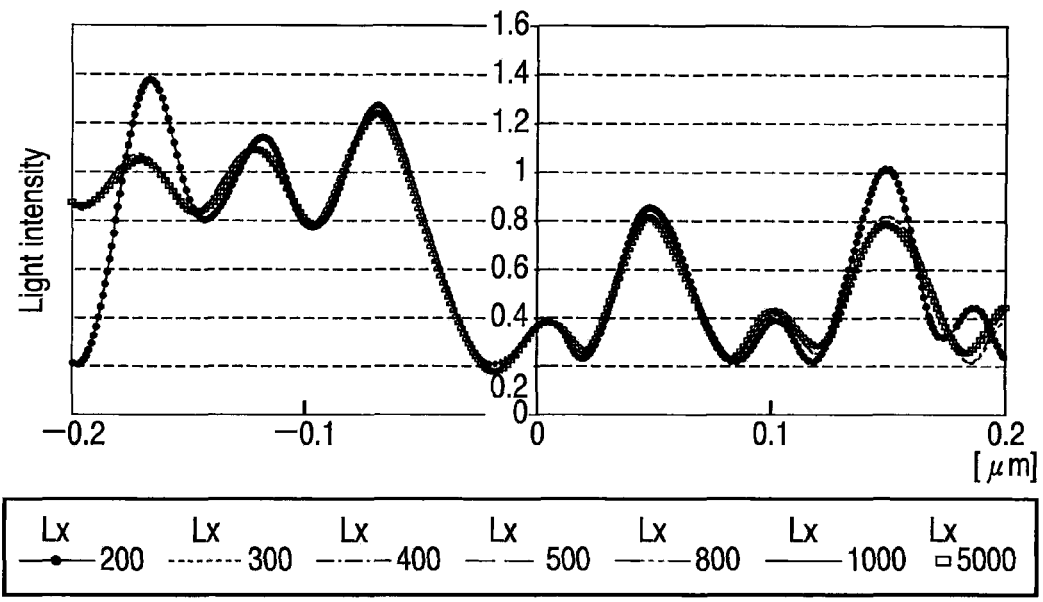
F I G. 3
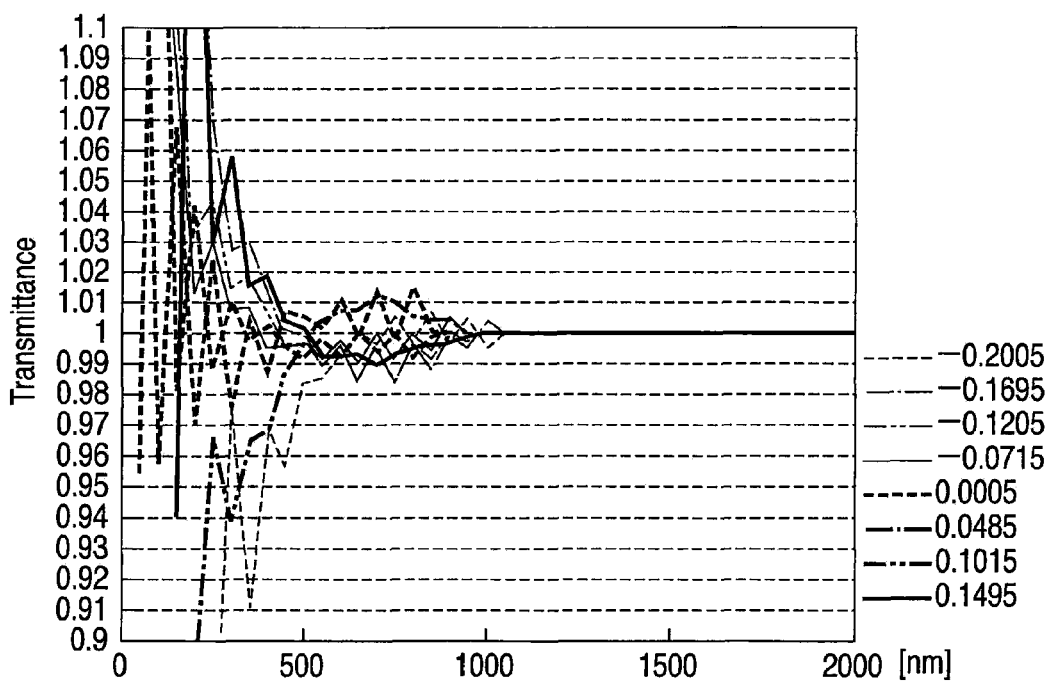
F I G. 4

LITHOGRAPHY SIMULATION METHOD, COMPUTER PROGRAM PRODUCT, AND PATTERN FORMING METHOD

CROSS-REFERENCE TO RELATED APPLICATIONS

This application is based upon and claims the benefit of priority from prior Japanese Patent Application No. 2008-147106, filed Jun. 4, 2008, the entire contents of which are incorporated herein by reference.

BACKGROUND OF THE INVENTION

1. Field of the Invention

The present invention relates to a lithography simulation method, computer program product, and pattern forming method used in a semiconductor field.

2. Description of the Related Art

As miniaturization of semiconductor circuits is progressing, a transistor line width of 50 nm or less and a wiring pitch of 200 nm or less are necessary in the non-memory semiconductor integrated circuits such as MPU, ASIC and system LSI. In recent years, the miniaturization of a memory cell pitch of Flash memory products as well as the miniaturization of the transistor lien width promotes a development of lithography technique.

On the other hand, as to a corresponding development of exposure technique (advancing of resolution), shortening of an exposure light wavelength stops at KrF (248 nm) to ArF (193 nm), and $F_2$ (157 nm) development is out of a load map due to a problem such as of optical system. As candidates of NGL (Next Generation Lithography), EUVL (Extreme Ultra Violet Lithograph: wavelength: X ray with wavelength of 13.5 nm is used), EB (Electron Beam), NIL (Nano Imprint Lithography) and the like are developed, but they are not yet put to practical use.

The resolution is expressed by k (constant)×λ (wavelength)/NA (numerical aperture). For this reason, the manufacturers of exposure apparatuses realize high NA using an immersion exposure apparatus so as to heighten the resolution, and lengthen the life of ArF exposure since 2000s. As a result, a mask pattern has a structure whose size is equivalent to that of an exposure wavelength, and thus a deviation from the so-called Kirchhoff diffraction theory is getting more and more obvious. When further the miniaturization progresses, an extreme resolution enhancement technique (for example, dipole illumination+assist feature, small σ+Levenson phase shift mask) is required.

Since the resolution becomes high and a coherence area on a wafer (space coherence area) becomes larger than a conventional one in normalized dimension (normalized by wavelength/numerical aperture) equivalent, a distance affected by optical proximity effect on the wafer becomes relatively large.

In order to estimate an optical image on the wafer by using conventional lithography simulation method without lowering accuracy, an exact electromagnetic field analytical calculation (3D exact electromagnetic field calculation) should be conducted on a large area sufficiently wide for the distance affected by optical proximity effect on the wafer by using FDTD (finite difference time area) method (Jpn. Pat. Appln. KOKAI Publication No. 2007-248391), or RCWA (rigorous coupled wave analysis) method or the like. However, the 3D exact electromagnetic field calculation on the large area has a problem that enormous amount of calculation time is required.

BRIEF SUMMARY OF THE INVENTION

According to an aspect of the present invention, there is provided a lithography simulation method for estimating an optical image to be formed on a substrate when a mask pattern is transferred onto the substrate, the method comprising: dividing the mask pattern into a plurality of first calculation areas, the plurality of first calculation areas having sizes determined by a range affected by optical proximity effect, the range affected by optical proximity effect being obtained correspondingly to an exposure wavelength, a numerical aperture and an illumination shape which are used in the transferring the mask pattern onto the substrate; dividing the each of the plurality of first calculation areas into a plurality of second calculation areas; calculating a plurality of first electromagnetic field distributions which are formed by illuminating areas of the mask pattern which corresponds to the plurality of second calculation areas with exposure light; obtaining a plurality of second electromagnetic field distributions corresponding to the plurality of first calculation areas by synthesizing the plurality of first electromagnetic field distributions for each of the plurality of first calculation areas; and calculating the optical image to be formed on the substrate by using the plurality of second electromagnetic field distributions.

According to an aspect of the present invention, there is provided a computer program product configured to store program instructions for execution on a computer system enabling the computer system to perform a lithography simulation method for estimating an optical image to be formed on a substrate when a mask pattern is transferred onto the substrate, the program instructions comprising: an instruction to divide the mask pattern into a plurality of first calculation areas, the plurality of first calculation areas having sizes determined by a range affected by optical proximity effect, the range affected by optical proximity effect being obtained correspondingly to an exposure wavelength, a numerical aperture and an illumination shape which are used in the transferring the mask pattern onto the substrate; an instruction to divide the each of the plurality of first calculation areas into a plurality of second calculation areas; an instruction to calculate a plurality of first electromagnetic field distributions which are formed by illuminating areas of the mask pattern which corresponds to the plurality of second calculation areas with exposure light; an instruction to obtain a plurality of second electromagnetic field distributions corresponding to the plurality of first calculation areas by synthesizing the plurality of first electromagnetic field distributions for each of the plurality of first calculation areas; and an instruction to calculate the optical image to be formed on the substrate by using the plurality of second electromagnetic field distributions.

According to an aspect of the present invention, there is provided a pattern forming method comprising: forming a resist on a substrate; exposing the resist using a photo mask having a mask pattern to form resist pattern; and etching the substrate using the resist pattern to form a pattern; wherein the mask pattern is determined using a lithography simulation method for estimating an optical image to be formed on a substrate when a mask pattern is transferred onto the substrate, the method comprising: dividing the mask pattern into a plurality of first calculation areas, the plurality of first calculation areas having sizes determined by a range affected by optical proximity effect, the range affected by optical proximity effect being obtained correspondingly to an exposure wavelength, a numerical aperture and an illumination shape which are used in the transferring the mask pattern onto the substrate; dividing the each of the plurality of first calculation areas into a plurality of second calculation areas; calculating a plurality of first electromagnetic field distributions which are formed by illuminating areas of the mask pattern which corresponds to the plurality of second calculation areas with exposure light; obtaining a plurality of second electromagnetic field distributions corresponding to the plurality of first calculation areas by synthesizing the plurality of first electromagnetic field distributions for each of the plurality of first calculation areas; and calculating the optical image to be formed on the substrate by using the plurality of second electromagnetic field distributions.

BRIEF DESCRIPTION OF THE SEVERAL VIEWS OF THE DRAWING

FIGS. 1A and 1B are diagrams for explaining calculation examples of lithography simulation methods of comparative example and embodiment;

FIG. 2 is a diagram for explaining an evaluation pattern;

FIG. 3 is a diagram illustrating a calculation result of electric field amplitude distribution on a position near a mask pattern surface;

FIG. 4 is a diagram illustrating convergence of transmittance due to the difference of positions when calculation area is varied;

DETAILED DESCRIPTION OF THE INVENTION

Figure 5:
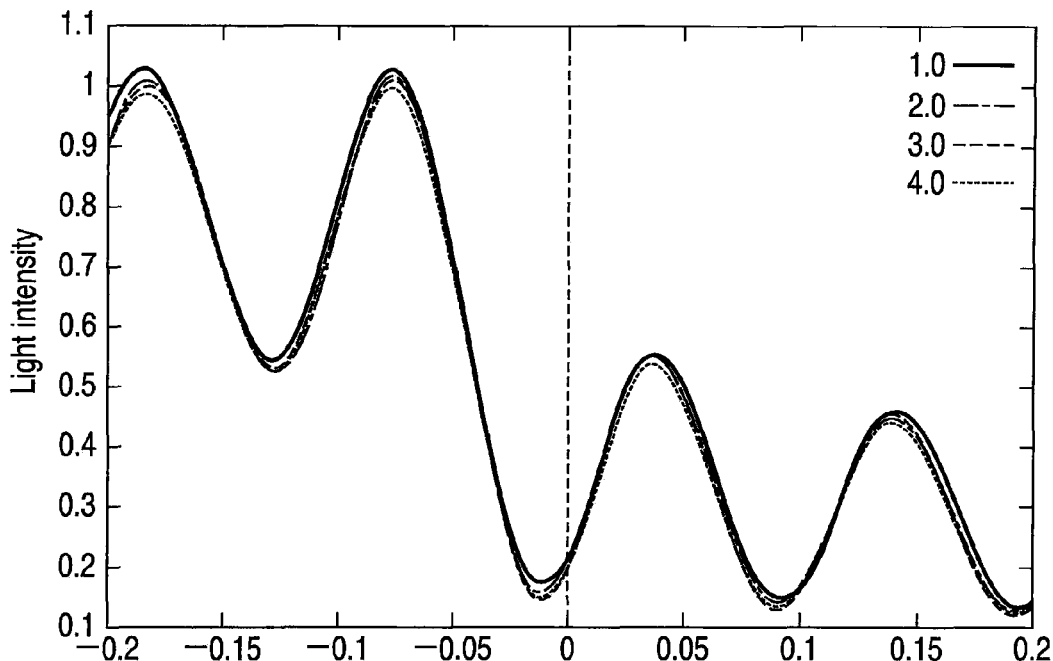
FIG. 5 is a diagram illustrating a calculation example of dependency on calculation areas of an optical image intensity distribution on a wafer.

An embodiment of the present invention is described below with reference to the drawings.

First Embodiment

FIG. 1A is a diagram for explaining calculation example of conventional lithography simulation method, and FIG. 1B is a diagram for explaining calculation example of lithography simulation method of an embodiment. In the following figures, the portions corresponding to the portions shown in the previously mentioned drawings are denoted by the same reference numerals and omitted its detail explanation.

In FIGS. 1A and 1B, Aref (reference area on wafer) represents a minimum unit area having influence one another in terms of an exposure calculation on a wafer, and Asim (calculation area on wafer) represents an area of the reference area on wafer Aref available for simulation calculation (exposure calculation).

In FIGS. 1A and 1B, Bref (reference area on mask) represents a minimum unit area having influence one another in terms of electromagnetic field analysis on a mask, and Bsim (calculation area on mask) represents an area of the reference area on mask Bref available for simulation calculation (3D exact electromagnetic field calculation) In FIG. 1A, the reference area on mask Bref overlaps with the reference area on wafer Aref.

In the method of the comparative example in FIG. 1A, with respect to one calculation area on wafer Asim, one calculation area on mask Bsim corresponding to the calculation area on wafer Asim is selected. When the calculation area on wafer Asim becomes large, the calculation area on wafer Bsim also becomes large. In recent years, since an area under the influence of optical proximity effect on the wafer has become large, the calculation area on wafer Asim has become large. Therefore, in the conventional method, the exact 3D exact electromagnetic field calculation should be conducted on the large calculation area on mask Bsim, and thus the calculation time becomes enormously long.

On the other hand, in the method of the embodiment in FIG. 1B, with respect to one calculation area on wafer Asim, a plurality of calculation areas on mask Bsim obtained by dividing one area on mask corresponding to the calculation area on wafer Asim is selected. Since each of the calculation areas on mask Bsim is small, the calculation of the exact 3D electromagnetic field takes shorter time than that in the conventional method, and the calculation time can be shortened. FIG. 1B illustrates the example that a hierarchical process for an electromagnetic field analysis and a hierarchical process for an exposure calculation are executed.

An example of the method for setting the reference area on wafer Aref and the reference area on mask Bref is described below. Here, the following calculating condition is used:

Exposure light: ArF (wavelength of 193 nm);
Numerical aperture (NA): 1.0;
Exposure mask substrate ($SiO_2$), refractive index: (1.563, 0i);
Mask pattern shielding portion (MoSi), refractive index: (2.343, 0.586i), film thickness: 71.4 nm; and
Calculation of a mask surface electromagnetic field by illumination on optical axis
illumination shape: σin=0.825, σout=0.97, open angle: 30°, two pupils illumination.

The method for setting the reference area on mask Bref is described below.

As shown in FIG. 2, as an evaluation pattern, a periodic end of a mask in which a mask pattern shielding portion 2 (d1=71.4 nm) of a line and space pattern (space width L1=line width L2=200 nm) is formed on an exposure mask substrate 1 is used. The center of a first line of the line and space pattern is set as an original point of a calculation coordinate (X=0). A plurality of calculation areas Lx (=200 nm, 300 nm, 400 nm, 500 nm, 800 nm, 1000 nm and 5000 nm) for electromagnetic field of the mask pattern plane are selected, in which the calculation areas Lx are determined by a plurality of distances defined by using the original point as a center. A calculation area (LX) dependence of the electric field amplitude distribution under the mask pattern plane by constant distance (here, D=80 nm (near the mask pattern plane)) is calculated. FIG. 3 illustrates calculation result of the calculation area dependence of the electric field amplitude distribution in an area of ±0.8 μm from the original point. From FIG. 3, it is seen that the dependence is degraded at Lx=200 nm (20 nm/4=50 nm in equivalent of dimension on the wafer).

FIG. 4 illustrates convergence of the transmittance when the calculation area (Lx) is varied at some positions (8 points) on the X-coordinate axis. Here the convergence is normalizing by using value of an electric field in an area of ±20 μm from the original point as a standard value, in which the electric field is formed by the electromagnetic field of the mask pattern plane.

From FIG. 4, when accuracy of transmittance fluctuation range of ±2% is required, an area of a center portion 1.6 μm (0.8 μm×2) can be used by setting 2 Lx=4 μm. From another viewpoint, if a margin area of 1.2 μm from a boundary of the mask surface electric field calculation area (Bref) is secured, an electric field calculation value on the mask surface electric field calculation area inside the margin area can be used. From still another viewpoint, the distance affected by optical proximity effect on the mask electric field calculation is 1.2 μm.

Next, the method for setting the reference area on wafer Aref is described below.

FIG. 5 illustrates an example of calculation about calculation area dependence of the optical image intensity distribution on the wafer.

From FIG. 5, it is seen that the calculation area at least Lx=1.0 μm has a bad and insufficient convergence compared to the case of the calculation area of the optical image result Lx=4.0 μm. It is considered that the calculation area Lx should be at least 2.0 μm in order to obtain accuracy, and the calculation area Lx should be 3.0 μm in order to obtain sufficient accuracy.

The setting values of the calculation areas on wafer Asim and Nsim for securing necessary accuracy may be different between the reference area on wafer Aref and the reference area on mask Bref. As a result, if the calculation area on wafer Asim for obtaining the optical image accuracy on wafer is set directly as the calculation area on mask Bsim (conventional technique), the calculation amount needed for one electromagnetic field calculation becomes enormous. Therefore, calculation efficiency may be noticeably lowered, or the calculation cannot be carried out unless a distributed process or the like is incorporated in the calculation algorithm.

On the other hand, in the present embodiment, the calculation area on wafer Asim is not directly set as the calculation area on mask Bsim, but the calculation area on mask Bsim is set so that the necessary accuracy of the electromagnetic field distribution is obtained. As a result, since the calculation area on mask Bsim can be small, a load on one electric field calculation can be reduced. Thereby, the compatibility to a distributed calculating system widely used for OPC process or the like at the present is improved, and simulation with higher accuracy can be carried out without significantly changing the current calculation system.

In the present embodiment, the most suitable calculation areas Asim and Bsim are obtained with respect to the memory capacity of calculator for calculating the electric field, and the distances affected by optical proximity effect are defined as the margin areas for the most suitable calculation areas Asim and Bsim, and then the inners of the margin areas are defined as the effective electric field calculation areas. In addition, a hierarchical optimizing process is executed for the effective electric field calculation areas so that the entire mask pattern surface is covered.

Figure 6:
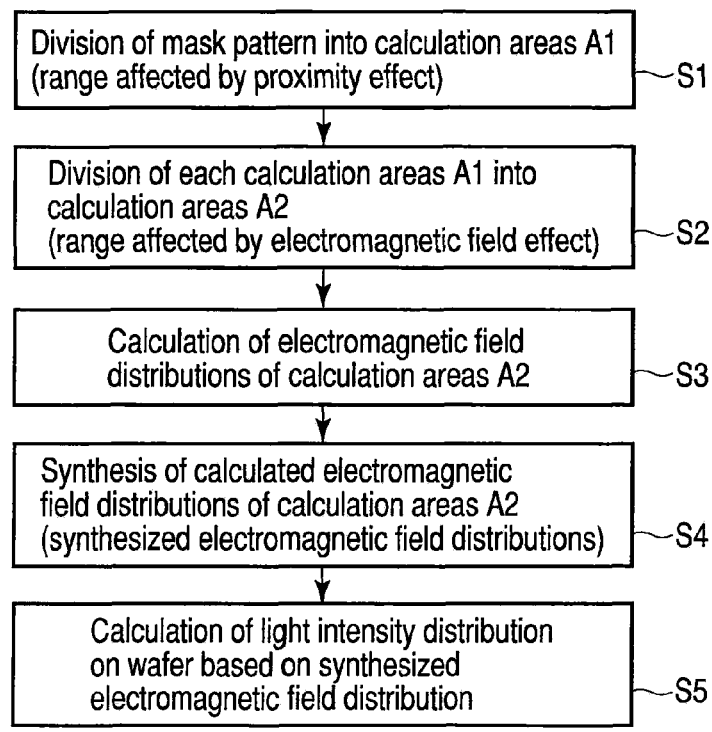
FIG. 6 is a flow chart illustrating a lithography simulation method of an embodiment.

FIG. 6 illustrates a flow chart of the lithography simulation method of the present embodiment.

The lithography simulation method of the present embodiment is for estimating an optical image formed on a substrate at a step of transferring a mask pattern onto the substrate.

The substrate is a semiconductor substrate (wafer), or a semiconductor substrate (wafer) including an insulating film, a semiconductor film or a metal film formed on the semiconductor substrate, and a resist as a top layer. The optical image is an optical image of a mask pattern projected onto the resist or a resist pattern obtained by developing the resist onto which the optical image of the mask pattern is projected.

First, mask pattern of a mask is divided into a plurality of first calculation areas A1 (step S1). The calculation areas A1 are areas having size corresponding to the range affected by optical proximity effect (reference area on mask Bref) which is calculated based on a wavelength, a numerical aperture (NA) and an illumination shape of an exposure light (exposure light source) to be used.

Next, each of the calculation areas A1 is divided into a plurality of second calculation areas A2 (step S2). The calculation areas A2 are areas corresponding to the range affected by optical proximity effect (calculation area on mask Bsim) which is obtained corresponding to the exposure wavelength to be used.

Next, for each of the plurality of first calculation areas A1, a plurality of electromagnetic field distributions corresponding to the plurality of second calculation areas A2 are calculated in which the plurality of electromagnetic field distributions are formed by illuminated the mask pattern with the exposure light (step S3).

Next, the calculated electromagnetic field distributions are synthesized, and this synthesized electromagnetic field distribution is used as the electromagnetic field distribution corresponding to the calculation area A1 (step S4). This step is executed for each of the calculation areas A1.

Finally, a light intensity distribution (optical image) corresponding to the mask pattern formed on the substrate is calculated by known calculating method (for example, partial coherent imaging calculation) using the synthesized electromagnetic field distributions of the calculation areas A1 (step S5).

Thereafter, a verification is conducted on the light intensity distribution (optical image), if the result of verification is allowable, a photo mask having the mask pattern used in the simulation is formed, and a pattern is formed using the photo mask.

That is, firstly, a resist is applied on a substrate including a semiconductor substrate. The semiconductor substrate is, for example, a silicon substrate or SOI substrate.

Next, the photomask manufactured by the method used in the embodiment is arranged above the substrate, the resist is irradiated with light or charged beam via the photomask, thereafter development is performed to form a resist pattern.

Next, the substrate is etched using the resist pattern as a mask to form a fine pattern. Thereafter, the resist pattern is removed.

Here, in the case where the underlying layer (the uppermost layer of the substrate) of the resist is a polycrystalline silicon film or a metal film, a fine electrode pattern or wiring pattern etc. is formed. In the case where the underlying layer (the uppermost layer of the substrate) of the resist is an insulating film, a fine contact hole pattern or gate insulating film etc. is formed. In the case where the underlying layer of the resist is the semiconductor substrate, a fine isolation trench (STI) etc. is formed.

The semiconductor device is manufactured by repeating the above mentioned procedures of applying a resist, forming a resist pattern and etching a substrate to form a required fine pattern.

On the other hand if the result of the verification rejectable, corrections such as OPC is applied on the pattern to correct the mask pattern The lithography simulation method of the present embodiment may be carried out as follows.

A pattern group including a plurality of patterns is created, in which the plurality of patterns are formed by dividing the mask pattern into the plurality of calculation areas A2, and if there exists patterns which are determined the same pattern by pattern matching, the pattern group is redefined by deeming the patterns as a single pattern. That is, the hierarchical process is executed. Thereby, the calculation amount required for calculating the electromagnetic field distributions at step S3 can be reduced, and the time needed for the simulation can be effectively shortened. The electromagnetic field distributions calculated at step S3 (calculation result) may be saved as a library.

In addition, in the step S2, the time required for the simulation can be effectively shortened by setting the sizes of second calculation areas A2 such that the sizes corresponds to the upper limit of memory (for example, DRAM) of calculator to be used. For example, the sizes of second calculation areas A2 is determined such that the number of second calculation areas A2 stored in the main memory correspond to the upper limit of storage capacitance of the main memory.

Figure 7:
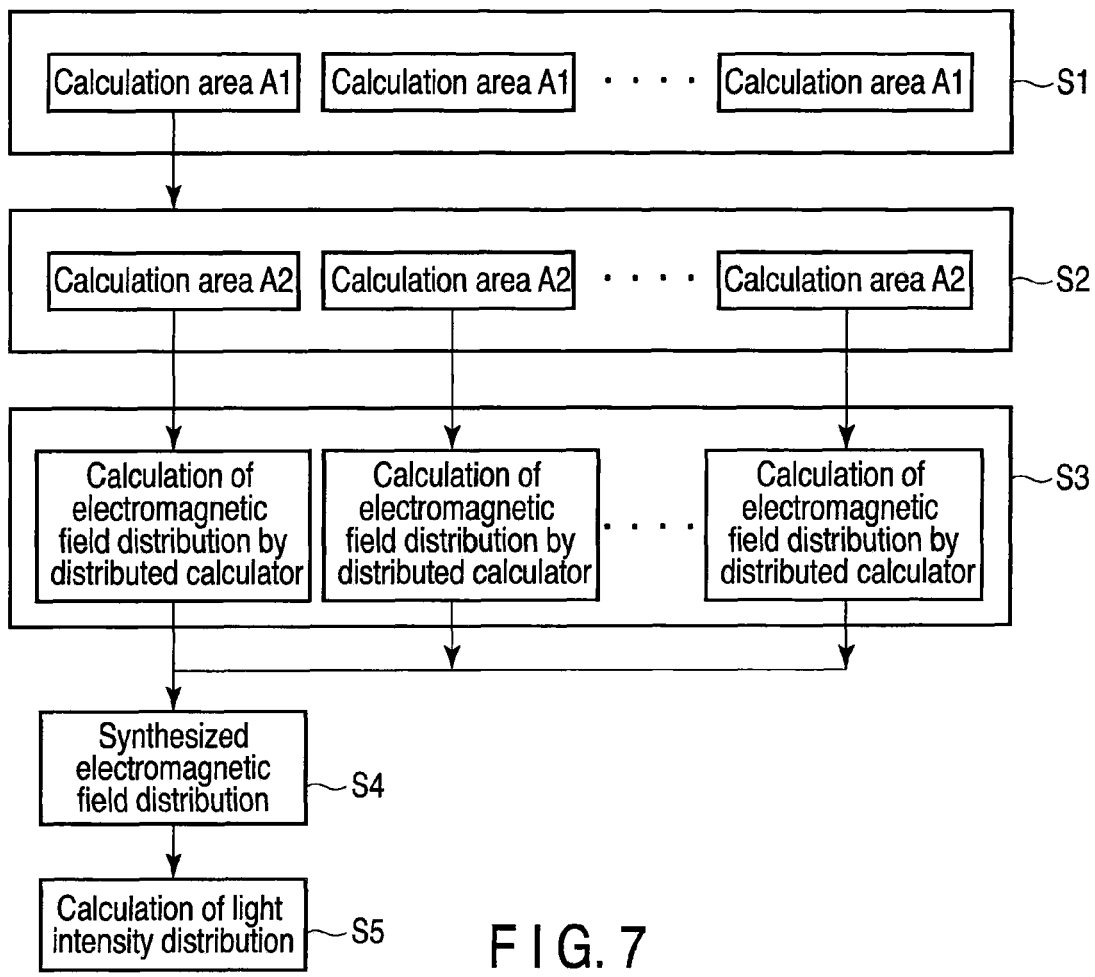
FIG. 7 is a flow chart illustrating another lithography simulation method of an embodiment.

In addition, as shown in FIG. 7, a distributing process (distributed calculating system) may be used, in which one calculator (distributed calculator) is allocated for each of the calculation areas A2, and the electromagnetic field distributions of the plurality of calculation areas A2 are simultaneously calculated. In this case, a management server for managing the plurality of distributed calculators may be a calculator different from the plurality of distributed calculators, or one of the plurality of distributed calculator may be used as the management server.

Figure 8:
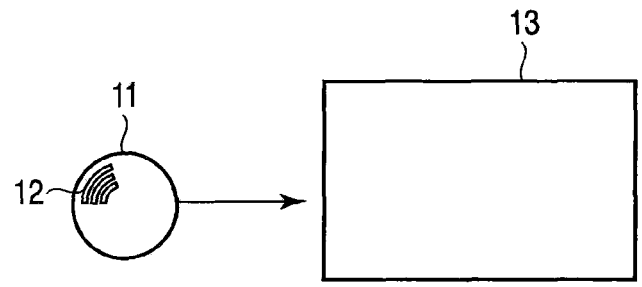
FIG. 8 is a computer program product of an embodiment.

Further, as shown in FIG. 8, the methods of the present embodiments described above can be implemented as a computer program product (for example, a CD-ROM, a DVD) 11 having recorded therein program 12 to be executed by a system including a computer 13.

For example, the computer program product 11 of the present embodiment is to cause the computer 13 to execute steps S1 to S5 (instructions) of FIG. 6 or FIG. 7.

The program 12 is executed by using hardware resources, such as a CPU and memory in the computer 13 (in some cases, an external memory is used together). The CPU reads necessary data from the memory and performs the above steps (instructions) on the data. The result of each step (instruction) is stored temporarily in the memory according to need and read out when it becomes necessary by other instructions.

The lithography simulation method and the computer program product of the embodiment for calculating (estimating) an optical image may be incorporated as a part of proximity effect correcting simulation method and computer program product.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
    forming a resist on a substrate;
    exposing the resist using a photo mask having a mask pattern to form resist pattern; and
    etching the substrate using the resist pattern to form a pattern;
    wherein the mask pattern is determined using a lithography simulation method for estimating an optical image to be formed on a substrate when a mask pattern is transferred onto the substrate, the method comprising:
        dividing the mask pattern into a plurality of first calculation areas, the plurality of first calculation areas having sizes determined by a range affected by optical proximity effect, the range affected by optical proximity effect being obtained correspondingly to an exposure wavelength, a numerical aperture and an illumination shape which are used in the transferring the mask pattern onto the substrate;
        dividing the each of the plurality of first calculation areas into a plurality of second calculation areas;
        calculating a plurality of first electromagnetic field distributions which are formed by illuminating areas of the mask pattern which corresponds to the plurality of second calculation areas with exposure light;
        obtaining a plurality of second electromagnetic field distributions corresponding to the plurality of first calculation areas by synthesizing the plurality of first electromagnetic field distributions for each of the plurality of first calculation areas; and
        calculating the optical image to be formed on the substrate by using the plurality of second electromagnetic field distributions.

2. A computer-implemented lithography simulation method for estimating an optical image to be formed on a substrate when a mask pattern is transferred onto the substrate, the method comprising:
    dividing, by a computer, the mask pattern into a plurality of first calculation areas, the plurality of first calculation areas having sizes determined by a range affected by optical proximity effect, the range affected by optical proximity effect being obtained correspondingly to an exposure wavelength, a numerical aperture and an illumination shape which are used in the transferring the mask pattern onto the substrate;
    dividing, by a computer, each of the plurality of first calculation areas into a plurality of second calculation areas;
    calculating, by a computer, a plurality of first electromagnetic field distributions which are formed by illuminating areas of the mask pattern which corresponds to the plurality of second calculation areas with exposure light;
    obtaining, by a computer, a plurality of second electromagnetic field distributions corresponding to the plurality of first calculation areas by synthesizing the plurality of first electromagnetic field distributions for each of the plurality of first calculation areas; and
    calculating, by a computer, the optical image to be formed on the substrate using the plurality of second electromagnetic field distributions.

3. The method according to claim 1,
    wherein the plurality of second calculation areas correspond to a range affected by near electromagnetic field at the mask pattern in which the near electric field is obtained correspondingly to the exposure wavelength used in the transferring the mask pattern onto the substrate.

4. The method according to claim 1, further comprising:
    forming, by a computer, a pattern group including a plurality of patterns obtained by dividing the mask pattern into the plurality of second calculation areas; and
    redefining, by a computer, the pattern group if the plurality of patterns includes patterns determined to be the same by pattern matching, the pattern group being redefined by setting the patterns determined to be the same as a single pattern.

5. The method according to claim 1,
    wherein the dividing the each of the plurality of first calculation areas into the plurality of second calculation areas includes determining the sizes of the second calculation areas to correspond to upper limit of a main memory of calculator used for the lithography simulation.

6. The method according to claim 1,
wherein the dividing the each of the plurality of first calculation areas into the plurality of second calculation areas includes determining the sizes of the second calculation such that number of second calculation areas stored in a main memory of calculator used for the lithography simulation correspond to the upper limit of storage capacitance of the main memory.

7. The method according to claim 1,
wherein the calculating the optical image is performed by using partial coherent imaging calculation.

8. The method according to claim 1,
wherein the plurality of second electromagnetic field distributions are simultaneously obtained by using a plurality of calculators in which one calculator is allocated for each of the plurality of second calculation areas.

9. The method according to claim 8, further comprising using a management server to manage the plurality of calculators.

10. The method according to claim 7,
wherein one of the plurality of calculators is used as a management server to manage the plurality of calculators.

11. A tangibly embodied non-transitory computer-readable storage medium storing program instructions for execution on a computer system enabling the computer system to perform a lithography simulation method for estimating an optical image to be formed on a substrate when a mask pattern is transferred onto the substrate, the program instructions comprising:
    instructions to divide the mask pattern into a plurality of first calculation areas, the plurality of first calculation areas having sizes determined by a range affected by optical proximity effect, the range affected by optical proximity effect being obtained correspondingly to an exposure wavelength, a numerical aperture and an illumination shape which are used in the transferring the mask pattern onto the substrate;
    instructions to divide each of the plurality of first calculation areas into a plurality of second calculation areas;
    instructions to calculate a plurality of first electromagnetic field distributions which are formed by illuminating areas of the mask pattern which correspond to the plurality of second calculation areas with exposure light;
    instructions to obtain a plurality of second electromagnetic field distributions corresponding to the plurality of first calculation areas by synthesizing the plurality of first electromagnetic field distributions for each of the plurality of first calculation areas; and
    instructions to calculate the optical image to be formed on the substrate by using the plurality of second electromagnetic field distributions.

* * * * *